US012750074B2

(12) United States Patent
Moon et al.

(10) Patent No.: US 12,750,074 B2
(45) Date of Patent: Sep. 29, 2026

(54) ELECTRONIC DEVICE INCLUDING COUPLER

(71) Applicant: SAMSUNG ELECTRONICS CO., LTD., Suwon-si (KR)

(72) Inventors: John Moon, Suwon-si (KR); Hyoseok Na, Suwon-si (KR); Dongil Yang, Suwon-si (KR); Doohwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 317 days.

(21) Appl. No.: 18/403,443

(22) Filed: Jan. 3, 2024

(65) Prior Publication Data

US 2024/0137052 A1 Apr. 25, 2024
US 2024/0235586 A9 Jul. 11, 2024

Related U.S. Application Data

(63) Continuation of application No. PCT/KR2023/016147, filed on Oct. 18, 2023.

(30) Foreign Application Priority Data

Oct. 18, 2022 (KR) ........................ 10-2022-0134291
Nov. 7, 2022 (KR) ........................ 10-2022-0147197

(51) Int. Cl.
*H04B 1/04* (2006.01)
*H03F 3/24* (2006.01)
*H04B 1/44* (2006.01)

(52) U.S. Cl.
CPC ........... *H04B 1/0458* (2013.01); *H03F 3/245* (2013.01); *H04B 1/0475* (2013.01); *H04B 1/44* (2013.01);
(Continued)

(58) Field of Classification Search
CPC ...... H04B 1/0458; H04B 1/0475; H04B 1/44; H04B 2001/0416; H04B 1/00; H04B 1/04; H03F 3/245; H03F 2200/294; H03F 3/72
See application file for complete search history.

(56) References Cited

U.S. PATENT DOCUMENTS 9,614,269 B2 4/2017 Srirattana et al.
10,097,171 B2 * 10/2018 Li .................... H03K 17/04106
(Continued)

FOREIGN PATENT DOCUMENTS

CN 111769851 A 10/2020
CN 113839688 A * 12/2021 ........... H04B 1/0458
(Continued)

OTHER PUBLICATIONS

International Search Report dated Jan. 25, 2024, issued by the International Searching Authority in International Application No. PCT/KR2023/016147.

*Primary Examiner* — Curtis A Kuntz
(74) *Attorney, Agent, or Firm* — Sughrue Mion, PLLC

(57) ABSTRACT

Provided is an electronic device including a transceiver configured to output a first transmission signal, a first radio frequency (RF) module configured to amplify the first transmission signal obtained from the transceiver to generate an amplified first transmission signal, a first antenna configured to transmit the amplified first transmission signal, and a main coupler provided outside the first RF module along a transmission path between the first RF module and the first antenna, and configured to output a first coupling signal corresponding to the first transmission signal. The first RF module includes at least one power amplifier configured to amplify the first transmission signal, and a switch configured to connect one of a plurality of input ports, including at least one input port connected to the main
(Continued)

coupler and configured to receive the first coupling signal output by the main coupler, with an output port connected to the transceiver.

17 Claims, 7 Drawing Sheets

(52) U.S. Cl.
CPC .................. *H03F 2200/294* (2013.01); *H04B 2001/0416* (2013.01)

(56) References Cited

U.S. PATENT DOCUMENTS

| | | | |
|---|---|---|---|
| 11,030,510 | B2 | 6/2021 | Yim |
| 11,239,873 | B2 | 2/2022 | Mori |
| 2013/0307624 | A1 | 11/2013 | Eplett |
| 2016/0079650 | A1 | 3/2016 | Solomko et al. |
| 2016/0172737 | A1 | 6/2016 | Srirattana et al. |
| 2016/0268994 | A1 | 9/2016 | Granger-Jones et al. |
| 2018/0205405 | A1* | 7/2018 | Lee .......................... H04B 1/30 |
| 2018/0366815 | A1 | 12/2018 | Rheinfelder et al. |
| 2019/0229700 | A1 | 7/2019 | Srirattana et al. |
| 2021/0105027 | A1* | 4/2021 | Moon .................. H04B 1/0064 |
| 2021/0328618 | A1 | 10/2021 | Tahara et al. |
| 2021/0408984 | A1* | 12/2021 | Arkiszewski ........... H03F 3/245 |
| 2022/0021406 | A1 | 1/2022 | Trautmann et al. |
| 2022/0311408 | A1 | 9/2022 | Liu et al. |
| 2023/0093847 | A1* | 3/2023 | Chen ...................... H04B 1/006 370/277 |

FOREIGN PATENT DOCUMENTS

| | | | |
|---|---|---|---|
| KR | 10-2017-0093208 | A | 8/2017 |
| KR | 10-2019-0129630 | A | 11/2019 |
| KR | 10-2403726 | B1 | 5/2022 |

* cited by examiner

ELECTRONIC DEVICE INCLUDING COUPLER

CROSS-REFERENCE TO RELATED APPLICATIONS

This application is bypass continuation of International Application No. PCT/KR2023/016147, filed on Oct. 18, 2023, which is based on and claims priority to Korean Patent Application No. 10-2022-0134291, filed on Oct. 18, 2022, and Korean Application No. 10-2022-0147197, filed on Nov. 7, 2022, in the Korean Intellectual Property Office, the disclosures of which are incorporated by reference herein in their entireties.

BACKGROUND

1. Field

The present disclosure relates to an electronic device, and more specifically an electronic device including an RF circuit and a coupler.

2. Description of Related Art

To meet the demand for wireless data traffic having increased since deployment of 4G communication systems, efforts have been made to develop an improved 5G or pre-5G communication system. Therefore, the 5G or pre-5G communication system is also called a "beyond 4G network" communication system or a "post LTE" system. The 5G communication system is considered to be implemented in ultrahigh frequency (mmWave) bands (e.g., 6 GHz or higher bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems. In addition, in 5G communication systems, development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

A portable electronic device (hereinafter referred to as an electronic device) may transmit/receive signals in an RF band to/from a base station of a 4G and/or 5G communication system. To this end, the electronic device may include an antenna that transmits and receives RF signals to and from the base station, and various circuit configurations to perform functions such as modulation/demodulation or amplification of signals, noise removal, etc. In order to provide a more superior communication environment when an electronic device communicates with a base station of a 4G and/or 5G system, it may be necessary for the electronic device to monitor the state of a signal transmitted through the antenna. For this purpose, the electronic device may include a coupler that acquires a coupling signal from the transmitted signal.

When supporting 4G and/or 5G communication, an electronic device may transmit and receive signals in multiple frequency bands. Accordingly, it is required to generate a coupling signal corresponding to a signal of each frequency band, and the electronic device may switch paths of a plurality of coupling signals using a coupler switch. In this case, switching noise may occur due to the coupler switch, and reception sensitivity of a received signal may be deteriorated due to the switching noise.

SUMMARY

According to an aspect of the disclosure, an electronic device includes: a transceiver configured to output a first transmission signal; a first radio frequency (RF) module configured to amplify the first transmission signal to generate an amplified first transmission signal; a first antenna configured to transmit the amplified first transmission signal; and a main coupler provided outside the first RF module along a transmission path between the first RF module and the first antenna, and configured to output a first coupling signal corresponding to the first transmission signal, where the first RF module comprises at least one power amplifier configured to amplify the first transmission signal, and a switch configured to connect one of a plurality of input ports with an output port connected to the transceiver, and where the plurality of input ports of the switch comprise at least one input port connected to the main coupler and configured to receive the first coupling signal output by the main coupler.

The plurality of input ports of the switch may include: a first input port configured to receive a forward coupling signal coupled from the first transmission signal; and a second input port configured to receive a reverse coupling signal coupled from a reflected signal corresponding to the first transmission signal.

The switch may be further configured to: connect the output port with the first input port in a first time period to provide the first coupling signal to the transceiver, based on the first coupling signal corresponding to a forward coupling signal; and connect the output port with the second input port in a second time period after the first time period to provide the first coupling signal to the transceiver, based on the first coupling signal corresponding to a reverse coupling signal.

The switch may further include a bidirectional coupler configured to generate the forward coupling signal and the reverse coupling signal.

The electronic device may further include: a second RF module provided outside the first RF module, and configured to amplify a second transmission signal to generate an amplified second transmission signal; and a second antenna configured to transmit the amplified second transmission signal, where the second RF module comprises an internal coupler provided inside the second RF module, and configured to generate a second coupling signal corresponding to the second transmission signal.

The switch may further include a third input port configured to receive the second coupling signal generated by the internal coupler of the second RF module.

The switch may be further configured to: connect the output port with the third input port in a third time period after the second time period to provide the second coupling signal generated by the internal coupler of the second RF module to the transceiver, based on the second coupling signal corresponding to a forward coupling signal; and connect the output port with the third input port in a fourth time period after the third time period to provide the second coupling signal generated by the internal coupler of the second RF module to the transceiver, based on the second coupling signal corresponding to a reverse coupling signal.

The switch may be further configured to turn off for a designated time period after the second time period, and connect the output port and the third input port in the third time period after the designated time period.

The first RF module may be configured to transmit the amplified first transmission signal through the first antenna in a first frequency band, and the second RF module may be configured to transmit the amplified second transmission signal through the second antenna in a second frequency band that is different.

The electronic device may be configured to support E-UTRAN NR-dual connectivity, the first RF module may be configured to generate the first transmission signal to be transmitted to a first cellular network, and the second RF module may be configured to generate the second transmission signal to be transmitted to a second cellular network.

The switch may be a complementary metal-oxide-semiconductor switch.

The first RF module may further include: an antenna switch configured to select between a transmission path of the first transmission signal, from the transceiver to the first antenna, and a reception path of a first reception signal received through the first antenna and provided to the transceiver, where the antenna switch and the switch are configured by one die.

The first RF module may further include at least one low-noise amplifier configured to low-noise amplify the first reception signal.

The transceiver may be configured to monitor at least one of a power of the first transmission signal, or a voltage standing wave ration of the first transmission signal, based on the first coupling signal.

The transceiver may further include an output port that is connectable to the main coupler.

The first RF module and the main coupler may be arranged on different areas on one printed circuit board.

According to various embodiments of the disclosure, in an electronic device including a coupler and a coupler switch, it is possible to reduce noise directly transmitted to an antenna path and improve sensitivity deterioration due to coupler switching.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
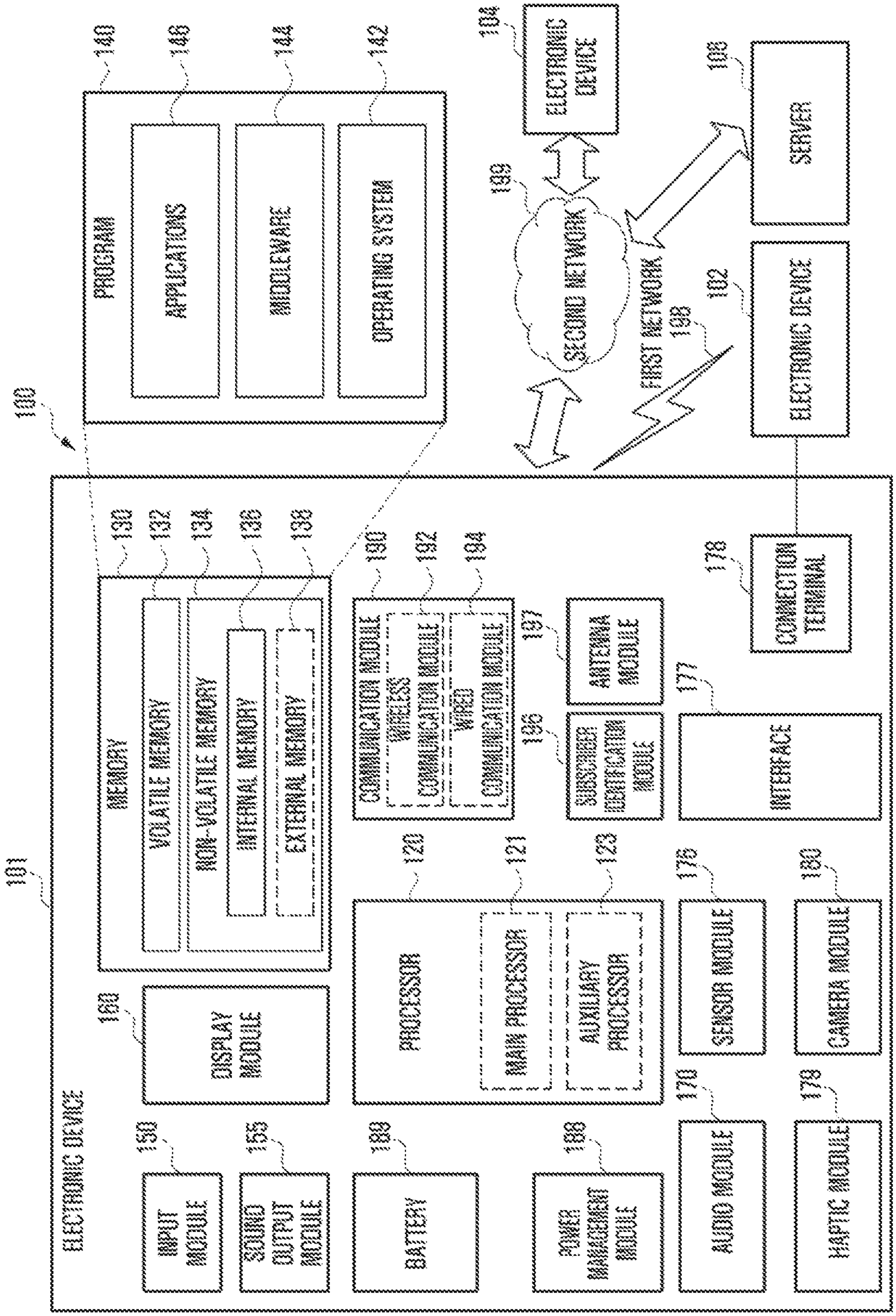
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199

(e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
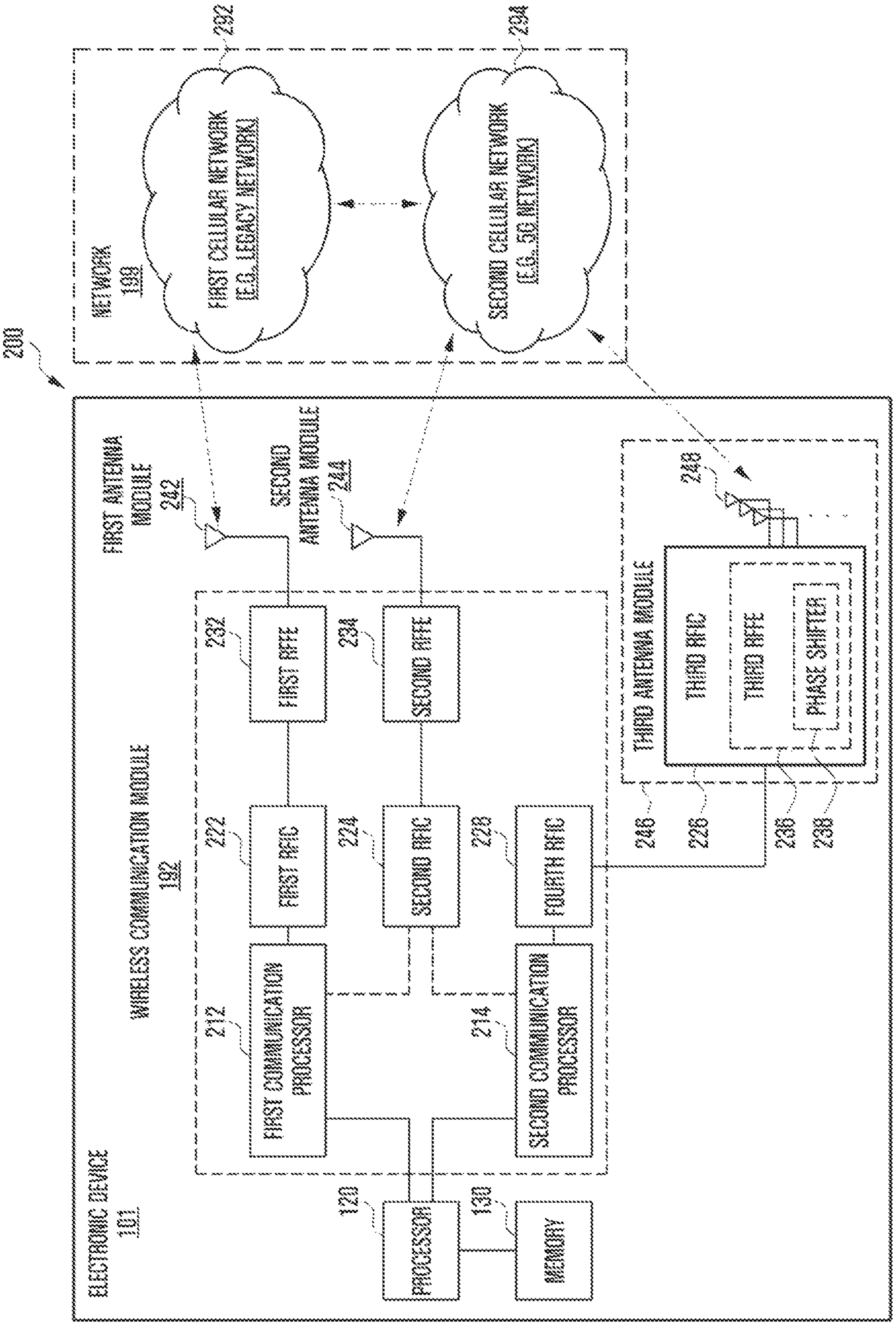
FIG. 2 is a block diagram illustrating an electronic device for supporting a plurality of networks according to various embodiments.

FIG. 2 is a block diagram illustrating an electronic device for supporting a plurality of networks according to various embodiments.

Referring to FIG. 2, an electronic device (e.g., a user terminal) 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. The second network 199 may include a first cellular network 292 and a second cellular network 294. According to another embodiment, the electronic device 101 may further include at least one of the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least part of the wireless communication module 192. According to another embodiment, the fourth RFIC 228 may be omitted or included as part of the third RFIC 226.

According to various embodiments, the first communication processor 212 may establish a communication channel of a band to be used for wireless communication with the first cellular network 292 and may support 4G network communication through the established communication channel. According to various embodiments, the first cellular network may be a 4G network that includes 2nd generation (2G), 3G, 4G, or long term evolution (LTE) network. The second communication processor 214 may establish a communication channel corresponding to a designated band (e.g., about 6 GHz to about 60 GHz) among bands to be used for wireless communication with the second cellular network 294, and may support 5G network communication through the established communication channel. According to various embodiments, the second cellular network 294 may be a 5G network defined by 3GPP. According to an embodiment, the first communication processor 212 or the second communication processor 214 may establish a communication channel corresponding to another designated band (e.g., about 6 GHz or less) among bands to be used for wireless communication with the second cellular network 294, and may support 5G network communication through the established communication channel. According to an embodiment, the first communication processor 212 and the second communication processor 214 may be implemented in a single chip or a single package. According to various embodiments, the first communication processor 212 or the second communication processor 214 may be provided in a single chip or single package with the processor 120, the auxiliary processor 123, or the communication module 190.

According to various embodiments, upon transmission, the first RFIC 222 may convert a baseband signal generated by the first communication processor 212 into a radio frequency (RF) signal of about 700 MHz to 3 GHz used in the first cellular network 292 (e.g., a 4G network). Upon reception, an RF signal may be acquired from the first cellular network 292 (e.g., a 4G network) through an antenna (e.g., the first antenna module 242), and may be preprocessed through an RFFE (e.g., the first RFFE 232). The first RFIC 222 may convert the preprocessed RF signal into a baseband signal so that the preprocessed RF signal can be processed by the first communication processor 212.

According to various embodiments, upon transmission, the second RFIC 224 may convert a baseband signal generated by the first communication processor 212 or the second communication processor 214 into an RF signal (hereinafter referred to as a 5G Sub6 RF signal) of a Sub6 band (e.g., about 6 GHz or less) used in the second cellular network 294 (e.g., a 5G network). Upon reception, a 5G Sub6 RF signal may be acquired from the second cellular network 294 (e.g., a 5G network) through an antenna (e.g., the second antenna module 244), and may be preprocessed through an RFFE (e.g., the second RFFE 234). The second RFIC 224 may convert the preprocessed 5G Sub6 RF signal into a baseband signal so that the preprocessed 5G Sub RF signal can be processed by the corresponding communication processor of the first communication processor 212 or the second communication processor 214.

According to various embodiments, the third RFIC 226 may convert a baseband signal generated by the second communication processor 214 into an RF signal (hereinafter referred to as a 5G Above6 RF signal) of a 5G Above6 band (e.g., about 6 GHz to about 60 GHz) to be used in the second cellular network 294 (e.g., a 5G network). Upon reception, the 5G Above6 RF signal may be acquired from the second cellular network 294 (e.g., a 5G network) through an antenna (e.g., the antenna 248), and may be preprocessed through the third RFFE 236. The third RFIC 226 may convert the preprocessed 5G Above6 RF signal into a baseband signal so that the preprocessed 5G Above6 RF signal can be processed by the second communication processor 214. According to an embodiment, the third RFFE 236 may be provided as part of the third RFIC 226.

According to an embodiment, the electronic device 101 may include the fourth RFIC 228 separately from or at least a part of the third RFIC 226. In this case, the fourth RFIC 228 may convert the baseband signal generated by the second communication processor 214 into an intermediate frequency (IF) signal, that is an RF signal of an intermediate frequency band (e.g., about 9 GHz to about 11 GHz), and may then transmit the IF signal to the third RFIC 226. The third RFIC 226 may convert the IF signal into a 5G Above6 RF signal. Upon reception, the 5G Above6 RF signal may be received from a second cellular network 294 (e.g., 5G network) through an antenna (e.g., the antenna 248) and may be converted into an IF signal by the third RFIC 226. The fourth RFIC 228 may convert the IF signal into a baseband signal so that the IF signal can be processed by the second communication processor 214.

According to an embodiment, the first RFIC 222 and the second RFIC 224 may be implemented as a single chip or at least part of a single package. According to an embodiment, the first RFFE 232 and the second RFFE 234 may be implemented as a single chip or at least part of a single package. According to an embodiment, at least one antenna module of the first antenna module 242 or the second antenna module 244 may be omitted or combined with another antenna module to process RF signals of a plurality of corresponding bands.

According to an embodiment, the third RFIC 226 and the antenna 248 may be arranged on the same substrate to form the third antenna module 246. For example, the wireless communication module 192 or the processor 120 may be arranged on a first substrate (e.g., a main PCB). In this case, the third RFIC 226 may be arranged in a portion (e.g., a lower surface) of a second substrate (e.g., a sub PCB) separate from the first substrate and the antenna 248 may be arranged in another portion (e.g., an upper surface) thereof to form the third antenna module 246. By arranging the third RFIC 226 and the antenna 248 on the same substrate, it is possible to reduce the length of a transmission line therebetween. This may reduce, for example, a loss (e.g., attenuation) of a signal of a high frequency band (e.g., about 6 GHz to about 60 GHz) used in 5G network communication due to the transmission line. As a result, the electronic device 101 may improve the quality or speed of communication with the second cellular network 294 (e.g., 5G network).

According to an embodiment, the antenna 248 may be formed of an antenna array including a plurality of antenna elements that may be used for beamforming. In this case, the third RFIC 226 may include, for example, as part of the third RFFE 236, a plurality of phase shifters 238 corresponding to the plurality of antenna elements. Upon transmission, each of the plurality of phase shifters 238 may convert the phase of a 5G Above6 RF signal to be transmitted to the outside (e.g., a base station of a 5G network) of the electronic device 101 through the corresponding antenna element. Upon reception, each of the plurality of phase shifters 238 may convert the phase of the 5G Above6 RF signal received from the outside through the corresponding antenna element into the same or substantially the same phase. This may enable transmission or reception through beamforming between the electronic device 101 and the outside.

The second cellular network 294 (e.g., 5G network) may operate independently from (e.g., stand-alone {SA}) or connected to (e.g. non-stand alone {NSA}) the first cellular network 292 (e.g., 4G network). For example, a 5G network may include only an access network (e.g., a 5G radio access network {RAN} or a next generation RAN {NG RAN}) and may not include a core network (e.g., a next generation core {NGC}). In this case, after accessing the access network of the 5G network, the electronic device 101 may access an external network (e.g., the Internet) under the control of a core network (e.g., evolved packed core {EPC}) of the 4G network. Protocol information (e.g., LTE protocol information) for communication with the 4G network or protocol information (e.g., new radio (NR) protocol information) for communication with the 5G network may be stored in the memory 230, and may be accessed by other components (e.g., the processor 120, the first communication processor 212, or the second communication processor 214).

Figure 3:
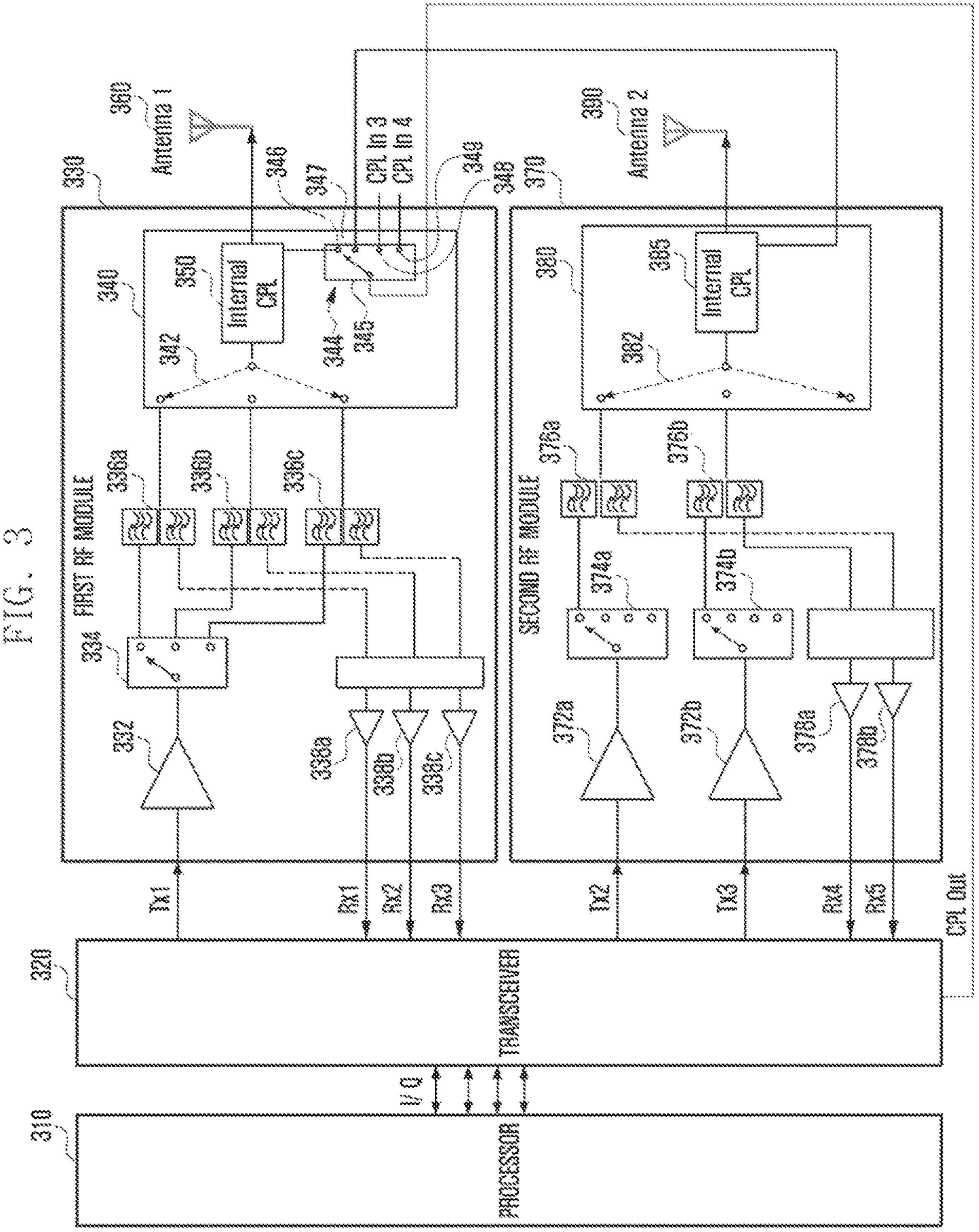
FIG. 3 illustrates a radio frequency (RF) circuit configuration of an electronic device according to an embodiment.

FIG. 3 illustrates an RF circuit configuration of an electronic device according to an embodiment.

Referring to FIG. 3, an electronic device 300 may include a processor 310, a transceiver 320, at least one RF module (e.g., first RF module 330 or second RF module 370), and at least one antenna (e.g., first antenna 360 or second antenna 390). Although FIG. 3 illustrates that the electronic device 300 includes a first RF module 330 and a second RF module 380, the electronic device 300 may include three or more RF modules. In addition, although FIG. 3 illustrates that the electronic device 300 includes the first antenna 360 and the second antenna 390, the electronic device 300 may include three or more antennas.

According to an embodiment, the electronic device 300 may support a plurality of RF frequency bands, and accordingly, when the electronic device 300 is designed, components used for wireless communication may be modularized and designed to improve development convenience and/or mounting area. For example, as shown in the first RF module 330 and the second RF module 380, a filter including a power amplifier (e.g., a power amplifier 332), which is a core component of a transmission terminal, a low-noise amplifier (e.g., a first low-noise amplifier 338*a*, a second low-noise amplifier 338*b*, or a third low-noise amplifier 338*c*), which is a core component of a reception terminal, and a duplexer (e.g., a first duplexer 336*a*, a second duplexer 336*b*, or a third duplexer 336*c*) may be modularized into a component such as LPAMiD and may be used.

According to an embodiment, the processor 310 may perform various control operations related to wireless communication with a network (e.g., the first cellular network 292 and the second cellular network 294 of FIG. 2). For example, the processor 310 may perform various control operations for establishing a communication channel and performing wireless communication with an external device (e.g., a 5G base station) using the established channel. A baseband signal generated by the processor 310 may be transmitted to the transceiver 320.

According to an embodiment, the transceiver 320 may perform various processes to output a signal received from the processor 310 through the antenna and to provide a signal received from the antenna to the processor 310. For example, the transceiver 320 may perform modulation and demodulation of a signal, and may convert a signal of a baseband into a signal of an RF band, or convert an RF signal into a baseband signal.

According to an embodiment, the electronic device 300 may include at least one RF module (e.g., first RF module 330 or second RF module 370). Each of the RF modules 330 and 370 may process signals of different cellular communication schemes (e.g., 4G LTE and 5G NR) and/or may process signals of different frequency bands. In the disclosure, the electronic device 300 is described as including the first RF module 330 and the second RF module 380, but the electronic device 300 may include three or more RF modules. Each of the RF modules may include at least one power amplifier (PA) (332, 372*a*, or 372*b*) for amplifying a signal received from the transceiver 320 and outputting the amplified signal through the antenna 360 or 390, and at least one low-noise amplifier (LNA) 338*a*, 339*b*, 338*c*, 378*a*, or 378*b* for low-noise amplifying a received signal of the antenna 360 or 390. Each of the RF modules 330 and 370 may also be referred to as an RF front end module or a Tx/Rx module.

According to an embodiment, the electronic device 300 may include at least one antenna (e.g., first antenna 360 or second antenna 390). Referring to FIG. 3, it is shown that one antenna 360 or 390 is arranged to correspond to each RF module 330 or 370, but the disclosure is not limited thereto, and a plurality of antennas may be connected to one RF module. According to an embodiment, each of the antennas 360 and 390 may be an array antenna including a plurality of antenna elements.

Referring to FIG. 3, the first RF module 330 may include the PA 332, a PA switch 334, the plurality of duplexers 336*a*, 336*b*, and 336*c*, the plurality of low-noise amplifiers 338*a*, 338*b*, and 338*c*, and a coupler module 340.

According to an embodiment, the PA 332 may amplify a transmission signal Tx1 transmitted from the transceiver 320. For example, the PA 332 may amplify the transmission signal Tx1 transmitted after being converted into an RF band from the transceiver 320 so that the first antenna 360 may output the transmission signal Tx1 at a high level. The PA 332 may be connected to any one of the first duplexer 336*a*, the second duplexer 336*b*, and the third duplexer 336*c* through the PA switch 334.

According to an embodiment, the first duplexer 336*a*, the second duplexer 336*b*, and the third duplexer 336*c* may be connected to the PA switch 334 and the coupler module 340, respectively. The first duplexer 336*a*, the second duplexer 336*b*, and the third duplexer 336*c* may separate paths of a transmission signal and a reception signal to perform filtering, so that a transmission signal transmitted from the PA 332 may be output to the side of the first antenna 360 and a reception signal transmitted from the first antenna 360 may be output to the LNAs 338*a*, 338*b*, and 338*c*. The first duplexer 336*a*, the second duplexer 336*b*, and the third duplexer 336*c* may be designed to filter signals of different frequency bands.

According to an embodiment, the first LNA 338*a*, the second LNA 338*b*, and the third LNA 338*c* may low-noise amplify a signal received from the first antenna 360 and transmitted. For example, the first LNA 338*a*, the second LNA 338*b*, and the third LNA 338*c* may amplify a low-level signal received from the first antenna 360 to increase the sensitivity of the entire Rx path and reduce noise. The first LNA 338*a* may be connected to the first duplexer 336*a*, the second LNA 338*b* may be connected to the second duplexer 336*b*, and the third LNA 338*c* may be connected to the third duplexer 336*c*. The first LNA 338*a*, the second LNA 338*b*, and the third LNA 338*c* may receive signals of different frequency bands, respectively, and may transmit the low-noise amplified signals Rx1, Rx2, and Rx3 to the transceiver 320.

According to an embodiment, the electronic device 300 may include the coupler module 340 for detecting power of a transmission signal and/or monitoring a voltage standing wave ration (VSWR), with respect to transmission signals of a plurality of supported RF bands. The coupler module 340 may be arranged in the transmission path of the RF signal and may output a coupling signal coupled from the transmission signal. In a modularized component such as LPAMiD, an antenna switch 342, a coupler switch 344, and an internal coupler 350 may be configured as one die. According to an embodiment, the coupler module 340 may also be referred to as an antenna switch/coupler integrated module.

Referring to FIG. 3, the coupler module 340 of the first RF module 330 may include the antenna switch 342, the internal coupler 350, and the coupler switch 344.

According to an embodiment, the antenna switch 342 may selectively connect between the internal coupler 350 and one of the first duplexer 336*a*, the second duplexer 336*b*, and the third duplexer 336*c*. For example, the antenna switch 342 may connect one of the first duplexer 336*a*, the second duplexer 336*b*, and the third duplexer 336*c* with the internal coupler 350 according to the frequency band of the transmission signal amplified and output by the power amplifier 332. The switching of the antenna switch 342 may be synchronized with the switching of the PA switch 334 to form a transmission path according to the frequency band of the transmission signal.

According to an embodiment, the internal coupler 350 may output a coupling signal coupled from the transmission signal. For example, the internal coupler 350 may output a coupling signal having a lower level than that of the transmission signal based on a coupling phenomenon based on inductive coupling. For example, the internal coupler 350 may be composed of various couplers such as a coupled line coupler or a quadrature hybrid coupler. According to an embodiment, a forward (FWD) coupling signal coupled with respect to a transmission signal in a direction from the first RF module 330 to the first antenna 360 and/or a reverse (RVS) coupling signal coupled with respect to a reflected signal from the antenna 360 to the first RF module 330 may be output from the internal coupler 350.

According to an embodiment, the second RF module 380 may include a plurality of power amplifiers 372*a* and 372*b*, a plurality of LNAs 378*a* and 378*b*, a plurality of duplexers 376*a* and 376*b*, and a coupler module 380. The configurations and/or functions of the power amplifiers 372*a* and 372*b*, the LNAs 378*a* and 378*b*, and the duplexers 376*a* and 376*b* included in the second RF module 380 may be substantially the same as those of the power amplifier 332, the LNAs 338*a*, 338*b*, and 338*c*, and the duplexers 336*a*, 336*b*, and 336*c* of the first RF module 330.

According to an embodiment, the electronic device 300 may further include an additional RF module in addition to the first RF module 330 and the second RF module 380, and the additional RF module, which is not shown, may include at least one power amplifier, at least one LNA, at least one duplexer, and an internal coupler.

According to an embodiment, the number of ports that can be connected to the couplers 350 and 385 in the transceiver 320 may be limited, and the transceiver 320 may be connected to the couplers 350 and 385 of the RF modules 330 and 380, respectively, through the coupler switch 344. For example, the transceiver 320 may be connected to an output port 345 of the coupler switch 344, and the coupler switch 344 may have a plurality of input ports 346, 347, 348, and 349 connected to the plurality of RF modules 330 and 370, respectively. The coupler switch 344 may sequentially switch the output port 345 and each of the input ports 346, 347, 348, and 349, and thus, the transceiver 320 may be sequentially connected to the internal couplers 350 and 385 of the RF modules 330 and 370, respectively.

Referring to FIG. 3, the electronic device 300 may include the coupler switch 344 embedded in the first RF module 330. The output port 345 of the coupler switch 344 may be connected to the transceiver 320. The first input port 346 of the coupler switch 344 may be connected to the internal coupler 350 of the first RF module 330, and the second input port 347 may be connected to the internal coupler 350 of the second RF module 370. The coupler switch 344 may further include at least one input port (e.g., a third input port 348 and a fourth input port 349), and the additional input port may include an RF circuit (e.g., a third RF circuit or a fourth RF circuit) which is not shown.

According to an embodiment, the electronic device 300 may transmit signals of a plurality of frequency bands using a plurality of antennas (e.g., the first antenna 360 and the second antenna 390). For example, the electronic device 300 may support EUTRA-NR dual connectivity (EN-DC), and may output a 4G LTE signal using the first RF module 330 and the first antenna 360 and output a 5G NR signal using the second RF module 380 and the second antenna 390. In this case, a coupling signal for each of a 4G LTE transmission signal and reflected signal and a 5G NR transmission signal and reflected signal may be required to be transmitted to the transceiver 320, and the coupler switch 344 may enable each coupling signal to be time-divided and transmitted to the transceiver 320 through the switching operation for each input port 346, 347, 348, or 349.

For example, when the first RF module 330 transmits a signal of band 8 (900 MHz band) of 4G LTE and the second RF module 380 transmits a signal of band 3 (1.8 GHz band) of 5G NR, the coupler switch 344 may perform repetitive switching such as forming path of forward coupling signal of band 8—forming path of reverse coupling signal of band 8—off state—forming path of forward coupling signal of band 3—forming path of reverse coupling signal of band 3—off state. In this case, a large number of times switching occurs in the first RF module 330 in which the coupler switch 344 is embedded, and noise may be generated by this switching operation. Here, when a coupler term is not properly determined or the switching timing is not accurate, the noise may become even larger. The noise generated by the coupler switch 344 may be coupled to the antenna switch 342 through the embedded coupler 350, and may be transmitted to the LNAs 338*a*, 338*b*, and 338*c* to deteriorate reception sensitivity.

Figure 4:
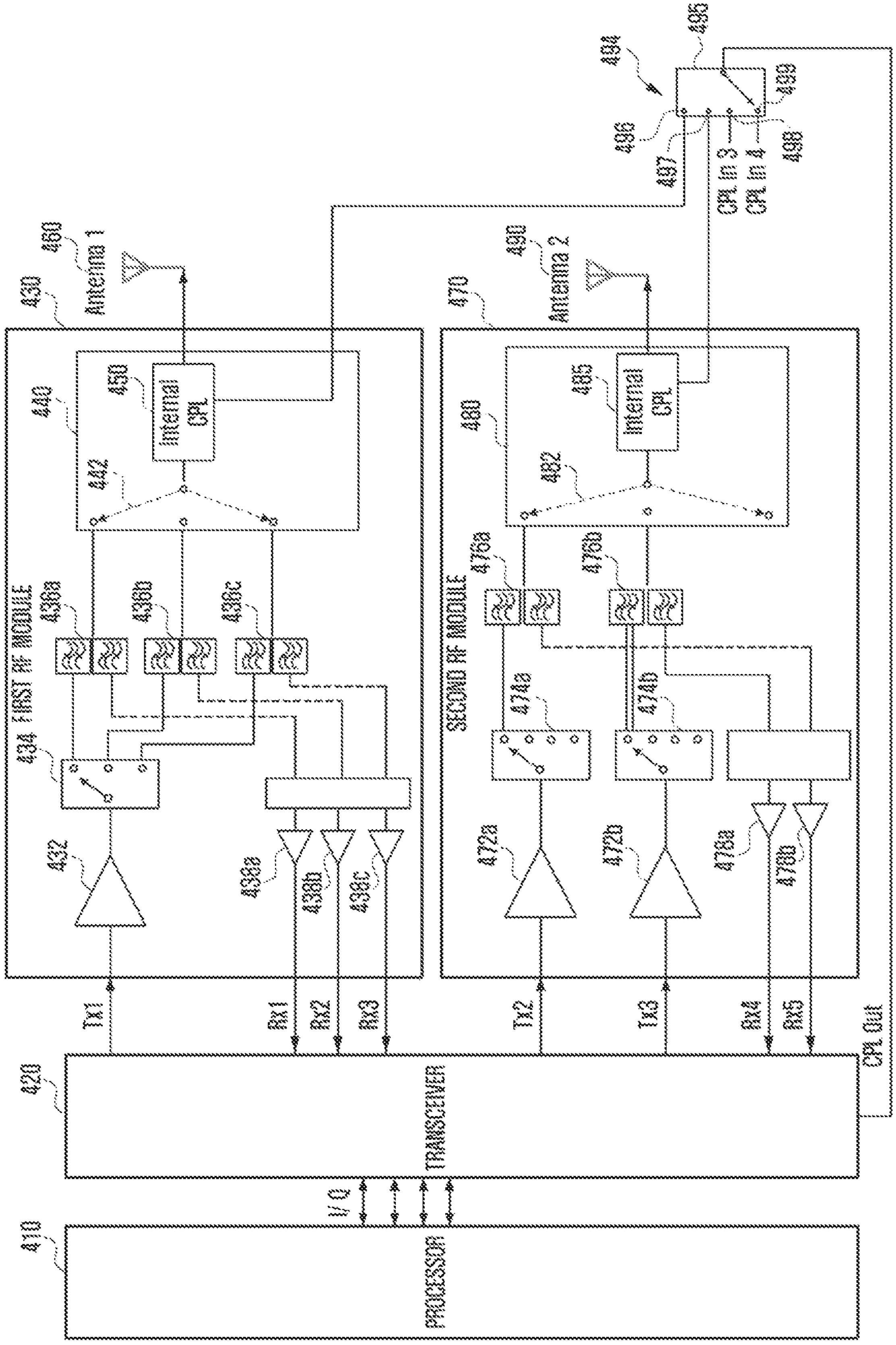
FIG. 4 illustrates an RF circuit configuration of an electronic device according to an embodiment.

FIG. 4 illustrates an RF circuit configuration of an electronic device according to an embodiment.

FIG. 4 illustrates an embodiment in which the coupler switch 494 is not embedded into the first RF module 430 and is arranged outside the first RF module 430 when compared to the embodiment of FIG. 3.

Referring to FIG. 4, the electronic device 400 may include a processor 410, a transceiver 420, at least one RF module (e.g., first RF module 430 and second RF module 470), and at least one antenna (e.g., first antenna 460 and second antenna 490). Here, the configuration and/or function of the processor 410 may be substantially the same as that of the processor 310 of FIG. 3, the configuration and/or function of the transceiver 320 may be substantially the same as that of the transceiver 320 of FIG. 3, and the configurations and/or functions of the first antenna 460 and the second antenna 490 may be substantially the same as those of the first antenna 360 and the second antenna 390 of FIG. 3. In addition, the configuration and/or functions of the power amplifier 432, plurality of LNAs 483a, 483b, and 438c, plurality of duplexers 436a, 436b, and 436c of the first RF module 430, and the plurality of power amplifiers 472a and 472b, plurality of LNAs 478a and 478b, and plurality of duplexers 476a and 476b of the second RF module 470 may be substantially the same as those of the power amplifier 332, plurality of LNAs 338a, 338b, and 338c, plurality of duplexers 336a, 336b, and 336c of the first RF module 330 of FIG. 3, and the plurality of power amplifiers 372a and 372b, plurality of LNAs 378a and 378b, plurality of duplexers 374a and 347b, of the second RF module 470.

According to an embodiment, the coupler module 440 of the first RF module 430 may include an antenna switch 442 and an embedded coupler 450. Compared to the coupler module 340 of the first RF module 330 of FIG. 3, the coupler module 440 may not include a coupler switch (e.g., the coupler switch 394 of FIG. 3).

According to an embodiment, the coupler switch 494 may be provided separately without being embedded into the first RF module 430 and the second RF module 470. An output port 495 of the coupler switch 494 may be connected to the transceiver 420, and a plurality of input ports 496, 497, 498, and 499 may be connected to the embedded coupler 450 of the first RF module 430, the embedded coupler 485 of the second RF module 470, and an embedded coupler of another RF module, which is not shown, respectively.

In the case of the electronic device 400 shown in FIG. 4, since switching occurs outside the RF modules 430 and 470, it is possible to relatively reduce switching noise, thereby improving the reception sensitivity. However, as the coupler switch 494 is arranged outside the RF modules 430 and 470, problems of increasing mounting space and material cost may occur during the manufacturing process of the electronic device 400. In addition, since switching of the forward coupling signal and the reverse coupling signal still occurs in the first RF module 430, it may be difficult to significantly improve the reception sensitivity.

Hereinafter, through FIGS. 5-7, various embodiments including a structure capable of reducing noise caused by switching of the coupler switch that occurs in the electronic device 300 of FIG. 3 and the electronic device 400 of FIG. 4 will be described.

Figure 5:
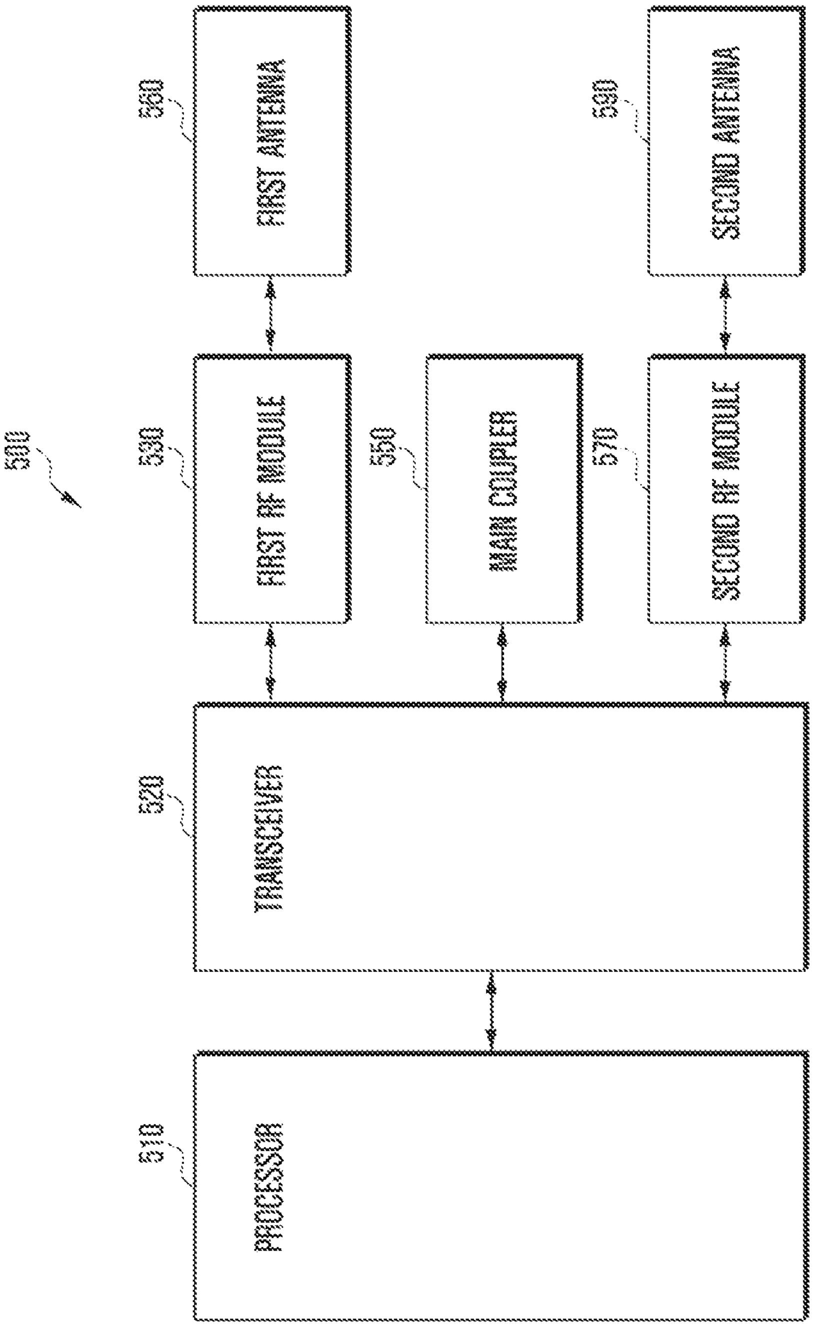
FIG. 5 is a block diagram illustrating an electronic device according to various embodiments.

FIG. 5 is a block diagram illustrating an electronic device according to various embodiments.

Referring to FIG. 5, an electronic device 500 may include a processor 510, a transceiver 520, at least one RF module (e.g., a first RF module 530 and a second RF module 570), at least one antenna (e.g., a first antenna 560 and a second antenna 590), and a main coupler 550. According to an embodiment, at least some of the illustrated components may be omitted. The electronic device 500 may further include at least some of the configurations and/or functions of the electronic device 101 of FIGS. 1 and 2.

According to various embodiments, the processor 510 may perform various control operations related to wireless communication with a network (e.g., the first cellular network 292 and the second cellular network 294 of FIG. 2). For example, the processor 510 may perform various control operations for establishing a communication channel and wireless communication with an external device (e.g., a 5G base station) using the established channel. The processor 510 may generate a baseband signal including data generated by an application and may transmit the generated baseband signal to the transceiver 520. The processor 510 may also be referred to as a communication processor, and may include at least some of configurations and/or functions of the communication processor included in the communication module 190 of FIG. 1. According to an embodiment, the processor 510 may include at least some of the configurations and/or functions of the processor 120 (e.g., an application processor) of FIG. 1.

According to an embodiment, the processor 510 may perform a function of controlling switches (e.g., a PA switch, an antenna switch, and a coupler switch) included in the RF modules 530 and 570. According to another embodiment, the electronic device 500 may include a separate switch control circuit that performs the control function of the switches included in the RF modules 530 and 570.

According to various embodiments, the transceiver 520 may perform various processes when providing signals received from the antennas 560 or 590 to the processor 510, or for outputting signals received from the processor 510 through the antennas 560 and 590. For example, the transceiver 520 may perform modulation and demodulation of a signal, and may convert a baseband signal into a radio frequency (RF) band signal or convert an RF signal into a baseband signal.

According to an embodiment, the electronic device 500 may include at least one RF module (e.g., first RF module 530 or second RF module 570). Although FIG. 5 illustrates that the electronic device 500 includes the first RF module 530 and the second RF module 570, the electronic device 500 may include three or more RF modules.

According to various embodiments, the RF modules 530 and 570 may be referred to as RF front end modules or Tx/Rx modules, and may include various circuit configurations required for transmission of RF signals between the transceiver 520 and the antennas 560 and 590. According to an embodiment, the first RF module 530 may include at least one power amplifier (e.g., a power amplifier 532 of FIGS. 6 and 7), at least one LNA (e.g., a first LNA 538a, a second LNA 538b, and a third LNA 538c of FIGS. 6 and 7), at least one duplexer (e.g., a first duplexer 536a, a second duplexer 536b, and a third duplexer 536c of FIGS. 6 and 7), and a switch module (e.g., a switch module 540 of FIGS. 6 and 7). The second RF module 570 may include at least one power amplifier (e.g., a first power amplifier 572a and a second power amplifier 572b of FIG. 7), at least one LNA (e.g., a first LNA 578a and a second LNA 578b of FIG. 7), at least one duplexer (e.g., a first duplexer 576a and a second duplexer 576b of FIG. 7), and a coupler module (a coupler module 580 of FIG. 7). The detailed circuit structure of the first RF module 530 and the second RF module 570 will be described in more detail with reference to FIGS. 6 and 7.

According to various embodiments, the electronic device 500 may include at least one antenna (e.g., first antenna 560 or second antenna 590). FIG. 5 illustrates that the electronic device 500 includes the first antenna 560 and the second antenna 590, the electronic device 500 may include three or more antennas. The first antenna 560 may output a first transmission signal amplified by the first RF module 530, and the second antenna 590 may output a second RF signal amplified by the second RF module 570. According to an embodiment, the first antenna 560 and the second antenna 590 may be formed as an array antenna including a plurality of antenna elements.

According to various embodiments, the main coupler 550 may be arranged on a transmission path between the first RF module 530 and the first antenna 560. A coupling signal corresponding to the first transmission signal output from the main coupler 550 through the first antenna 560 may be output. The main coupler 550 may be composed of various couplers such as a coupled line coupler and a quadrature hybrid coupler. According to an embodiment, the main coupler 550 may be a bi-directional coupler. For example, the main coupler 550 may be composed of a bi-directional coupler, and a forward (FWD) coupling signal coupled with respect to a transmission signal in a direction from the first RF module 530 to the first antenna 560 and a reverse (RV S) coupling signal coupled with respect to a reflected signal from the first antenna 560 to the first RF module 530 may be output from the main coupler 550.

According to various embodiments, the main coupler 550 may be provided outside the first RF module 530 and the 2RF module 570. That is, the main coupler 550 may be designed and/or manufactured as a separate component from the RF modules 530 and 570. As the main coupler 550 is designed separately from the RF modules 530 and 570, the main coupler 550 may be designed with a larger size than that of the coupler (e.g., the internal coupler 350 of FIG. 3 and the internal coupler 450 of FIG. 4) when the coupler is embedded into the RF modules 530 and 570, and the path and distance of the received signal of the antennas 560 and 590 may be formed. According to an embodiment, the main coupler 550 may be connected to a fixed ground (e.g., term).

According to an embodiment, the main coupler 550 may be arranged on different areas on the first RF module 530 and a printed circuit board (PCB). For example, the main coupler 550 may be drawn on another area on the PCB and may be electrically connected to the first RF module 530 and the first antenna 560 by utilizing embedded coupler technology. According to an embodiment, the main coupler 550 may be configured as a separate chip from the RF modules 530 and 570.

According to various embodiments, the first RF module 530 may include a coupler switch (e.g., the coupler switch 544 of FIGS. 6 and 7) (e.g., a switch) that selectively connects (e.g., switches) between an output port connected to the transceiver 520 and one of a plurality of input ports. According to various embodiments, the plurality of input ports of the coupler switch may include at least one input port connected to the main coupler 550 and into which a coupling signal output by the main coupler 550 is input. For example, the coupler switch may include a first input port into which a FWD coupling signal coupled from the first transmission signal output through the first antenna 560 is input and a second input port into which a RVS coupling signal coupled from a reflected signal corresponding to the first transmission signal is input. According to an embodiment, the coupler switch may further include a third input port into which a coupling signal output by the internal coupler of the second RF module 570 is input.

According to various embodiments, the coupler switch may sequentially switch between the output port and the plurality of input ports. According to an embodiment, the coupler switch may perform switching so that the FWD coupling signal from the main coupler 550 is input to the transceiver 520 by connecting the output port and the first input port in a first period. The coupler switch may perform switch so that the RVS coupling signal from the main coupler 550 is input to the transceiver 520 by connecting the output port and the second input port in a second period. According to an embodiment, the coupler switch may be turned off in a third period, and the coupling signal may not be input to the transceiver 520 in an off state. This is to determine whether the corresponding coupling signal is the coupling signal of the first transmission signal of the first RF module 530 and the first antenna 560 in the transceiver 520 and/or the processor 510 or the coupling signal of the second transmission signal of the second RF module 570 and the second antenna 590 by putting a gap between an input of the coupling signal from the main coupler 550 and an input of the coupling signal from the internal coupler of the second RF module 570.

According to an embodiment, the coupler switch may perform switching so that the output port and the third input port are connected to each other in a fourth period, and the FWD coupling signal corresponding to the transmission signal of the transmission path of the second RF module 570 output from the internal coupler of the second RF module 570 may be transmitted to the transceiver 520 through the coupler switch. In the coupler switch, a connection between the output port and the third input port may be maintained in a fifth period, and the RVS coupling signal corresponding to the reflected signal of the transmission path of the second RF module 570 may be transmitted to the transceiver 520 through the coupler switch. According to an embodiment, the coupler switch may be turned off in a sixth period. The coupler switch may repeatedly perform switching of the first to sixth periods, and the transceiver 520 may distinguish and recognize the coupling signals obtained in each time period.

According to various embodiments, the transceiver 520 may use the coupling signal input via the coupler switch in the first period and the second period to monitor power and/or voltage standing wave ration (VSWR) of the first transmission signal, and may use the coupling signal input via the coupler switch in the fourth period and the fifth period after the off period to monitor power and/or VSWR of the second transmission signal.

The electronic device 500 according to various embodiments may use an external coupler 550 provided separately from the RF modules 530 and 570, so that a term may be fixedly determined to secure stable performance. In addition, since there is no path in which the coupler switch and the antenna switch are directly connected to each other, noise due to coupler switching may be reduced and sensitivity deterioration due to the noise may also be reduced. According to an embodiment, the electronic device 500 may design the main coupler 550 separately from the RF modules 530 and 570 by utilizing embedded coupler technology, and accordingly, a cost increase for adding a coupler does not occur and the RF modules 530 and 570 may be designed excluding the coupler, so that there is an advantage in terms of design cost.

Figure 6:
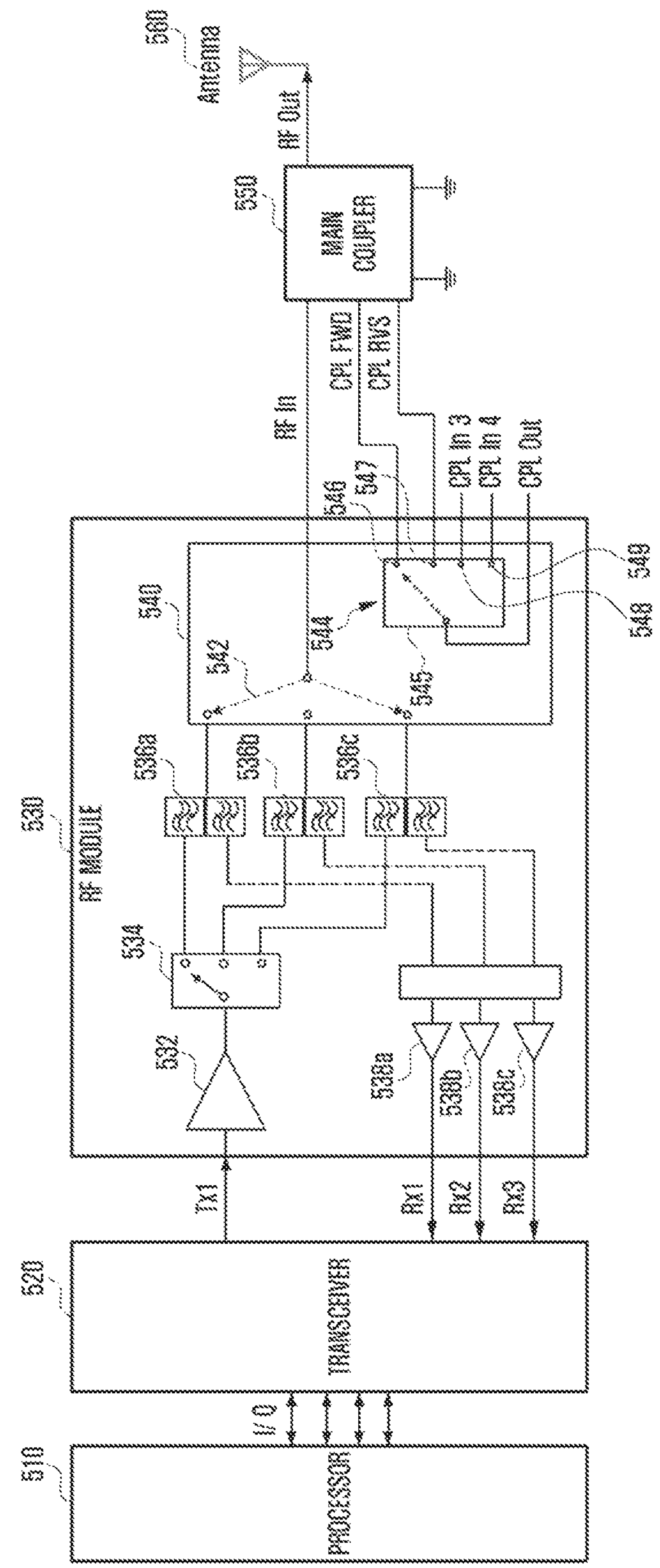
FIG. 6 illustrates an RF circuit configuration of an electronic device according to various embodiments.

FIG. 6 illustrates an RF circuit configuration of an electronic device according to various embodiments.

Referring to FIG. 6, the electronic device 500 may include the processor 510, the transceiver 520, the RF module 530, the main coupler 550, and the antenna 560. According to an embodiment, the electronic device 500 may include a plurality of RF modules (e.g., the first RF module 530 and the second RF module 570 of FIG. 5) and a plurality of antennas (e.g., the first antenna 560 and the second antenna 590 of FIG. 5) connected to the respective RF modules, and hereinafter, characteristics of each component in one transmission path through the RF module 530 and the antenna 560 will be described with reference to FIG. 6.

According to various embodiments, the processor 510 may generate a baseband signal including data generated by an application and transmit the generated baseband signal to the transceiver 520. The processor 510 may be a communication processor.

According to an embodiment, the transceiver 520 may perform various processes when outputting a signal received from the processor 510 through the antenna 560 or providing a signal received from the antenna 560 to the processor 510.

For example, the transceiver 520 may perform modulation and demodulation of a signal, and may convert a baseband signal into a radio frequency (RF) band signal or convert an RF signal into a baseband signal.

According to various embodiments, the RF module 530 may include various circuit configurations necessary for transmitting an RF signal between the transceiver 520 and an antenna. According to various embodiments, the RF module 530 may include at least one power amplifier 532, at least one LNAs 538*a*, 538*b*, and 538*c*, at least one duplexer 536*a*, 536*b*, and 536*c*, and a switch module 540.

According to various embodiments, the power amplifier 532 may be arranged in a transmission path of an RF signal to amplify a signal received from the transceiver 520. For example, the power amplifier 532 may amplify a transmission signal Tx1 transmitted after being converted into an RF band from the transceiver 520 so that the antenna 560 may output the transmission signal Tx1 at a high level. The power amplifier 532 may be connected to one of the first duplexer 536*a*, the second duplexer 536*b*, or the third duplexer 536*c* through a PA switch 534. In FIG. 6, the RF module 530 is illustrated as including one power amplifier 532, but is not limited thereto. For example, the RF module 530 may include two or more power amplifiers, and in this case, each power amplifier may be connected to each of the duplexers 536*a*, 536*b*, and 536*c* through the PA switch 534.

According to various embodiments, the first duplexer 536*a*, the second duplexer 536*b*, and the third duplexer 536*c* may be connected to the PA switch 534 and the switch module 540, respectively. The first duplexer 536*a*, the second duplexer 536*b*, and the third duplexer 536*c* may separate the paths of the transmission signal and the reception signal, so that the transmission signal transmitted from the power amplifier 532 may be output toward the antenna 560 and the reception signal transmitted from the antenna 560 may be filtered to be output to the LNAs 538*a*, 538*b*, and 538*c*. The first duplexer 536*a*, the second duplexer 536*b*, and the third duplexer 536*c* may be designed to filter signals of different frequency bands. Although FIG. 6 illustrates that the RF module 530 includes the first duplexer 536*a*, the second duplexer 536*b*, and the third duplexer 536*c*, the number of duplexers is not limited thereto.

According to various embodiments, the first LNA 538*a*, the second LNA 538*b*, and the third LNA 538*c* may low-noise amplify a signal received from the antenna 560 and transmitted. For example, the first LNA 538*a*, the second LNA 538*b*, and the third LNA 538*c* may low-noise amplify a low level signal received from the antenna 560 to increase the sensitivity of the entire Rx path and reduce noise. The first LNA 538*a* may be connected to the first duplexer 536*a*, the second LNA 538*b* may be connected to the second duplexer 536*b*, and the third LNA 538*c* may be connected to the third duplexer 536*c*. The first LNA 538*a*, the second LNA 538*b*, and the third LNA 538*c* may receive signals of different frequency bands, respectively, and may transmit the low-noise amplified signals Rx1, Rx2, and Rx3 to the transceiver 520. Although FIG. 6 shows that the RF module 530 includes the first LNA 538*a*, the second LNA 538*b*, and the third LNA 538*c*, the number of LNAs is not limited thereto.

According to various embodiments, the switch module 540 may include an antenna switch 542 and a coupler switch 544. According to various embodiments, the antenna switch 542 may perform a function of switching the path of a transmission signal and/or a reception signal. For example, the antenna switch 542 may synchronize with the switching of the PA switch 534, and may perform switching to form a transmission path such as the power amplifier 532—the PA switch 534—the first duplexer 536*a*, the second duplexer 536*b*, or the third duplexer 536*c*—the antenna 560. According to an embodiment, the antenna switch 542 may perform switching according to a control signal of the processor 510.

According to various embodiments, the coupler switch 544 (e.g., switch) may perform a function of selectively connecting (e.g., switching) between the transceiver 520 and the main coupler 550 or an internal coupler of another RF module. An output port 545 of the coupler switch 544 may be connected to the transceiver 520. Since the number of ports is limited, the transceiver 520 may include only one port for receiving a coupling signal. The transceiver 520 may sequentially receive coupling signals of a plurality of couplers (e.g., the main coupler 550 and an internal coupler of another RF module) according to the switching of the coupler switch 544.

According to various embodiments, the coupler switch 544 may include a plurality of input ports 546, 547, 548, and 549. According to an embodiment, the first input port 546 and the second input port 547 of the coupler switch 544 may be connected to the main coupler 550. Here, a FWD coupling signal corresponding to a transmission signal may be input from the main coupler 550 through the first input port 546, and a RVS coupling signal corresponding to a reflected signal may be input from the main coupler 550 through the second input port 547. The coupler switch 544 may further include at least one input port (e.g., a third input port 548 and a fourth input port 549), and the additional input ports 548 and 549 may be connected to other RF modules, respectively.

According to various embodiments, the coupler switch 544 may be configured as a complementary metal-oxide semiconductor (CMOS) switch.

According to various embodiments, the coupler switch 544 may be arranged on the transmission path of the RF signal from the main coupler 550, and a transmission signal to be output from the antenna 560 and/or a coupling signal of a reflected signal may be output. For example, based on a coupling phenomenon based on inductive coupling, the coupling signal having a lower level than that of the transmission signal may be output. For example, the main coupler 550 may include various couplers such as a coupled line coupler and a quadrature hybrid coupler. According to an embodiment, the main coupler 550 may be a bi-directional coupler. For example, the main coupler 550 may be configured as a bi-directional coupler, so that a FWD coupling signal coupled with respect to a transmission signal in a direction from the RF module 530 to the antenna 560 and a RVS coupling signal coupled with respect to a reflected signal from the antenna 560 to the RF module 530 may be output from the main coupler 550.

According to various embodiments, the main coupler 550 may be arranged outside the RF module 530. That is, the main coupler 550 may be designed and/or manufactured as a separate component from the RF module 530. As the main coupler 550 is designed separately from the RF module 530, the main coupler may be designed with a larger size than that of the coupler (e.g., the internal coupler 350 of FIG. 3 and the internal coupler 450 of FIG. 4) when the coupler is embedded into the RF module 530, and the path and distance of the received signal of the antenna 560 may be formed. According to an embodiment, the main coupler 550 may be connected to a fixed ground (e.g., term).

According to various embodiments, the main coupler 550 may be connected to two input ports 546 and 547 of the coupler switch 544. When the main coupler 550 outputs a FWD coupling signal, the coupler switch 544 may connect the first input port 546 and the output port 545, and the FWD coupling signal may be transmitted to the transceiver 520. When the main coupler 550 outputs a RVS coupling signal, the coupler switch 544 may connect the second input port 547 and the output port 545, and the RVS coupling signal may be transmitted to the transceiver 520.

According to an embodiment, the main coupler 550 may be arranged on different areas on the RF module 530 and a printed circuit board (PCB). For example, the main coupler 550 may be drawn on another area on the PCB and electrically connected to the RF module 530 and the antenna 560 by utilizing embedded coupler technology. According to an embodiment, the main coupler 550 may be configured as a separate chip from the RF module 530.

Figure 7:
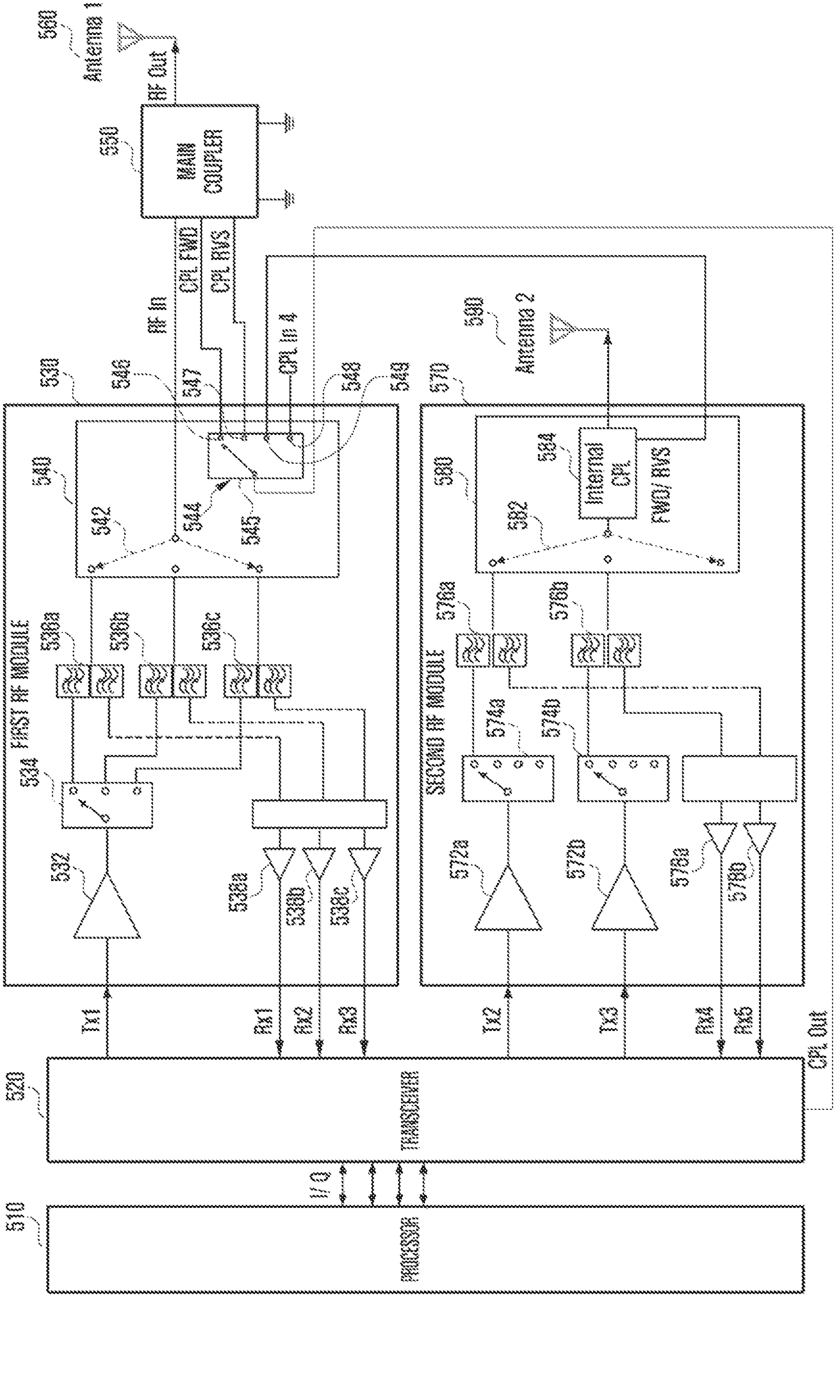
FIG. 7 illustrates an RF circuit configuration of an electronic device according to various embodiments.

FIG. 7 illustrates an RF circuit configuration of an electronic device according to various embodiments.

Referring to FIG. 7, the electronic device 500 may include the processor 510, the transceiver 520, the first RF module 530, the second RF module 570, the main coupler 550, the first antenna 560, and the second antenna 590. The configuration and/or function of the processor 510 may be substantially the same as that of the processor 510 of FIG. 6. The configuration and/or function of the transceiver 520 may be substantially the same as that of the transceiver 520 of FIG. 6. The configuration and/or function of the first RF module 530 may be substantially the same as that of the RF module 530 of FIG. 6. The configuration and/or function of the first antenna 560 may be substantially the same as that of the antenna 560 of FIG. 6. The configuration and/or function of the main coupler 550 may be substantially the same as that of the main coupler 550 of FIG. 6. Hereinafter, descriptions of the technical features that have been described with reference to FIG. 6 will be omitted.

According to various embodiments, the second RF module 570 may be connected to the transceiver 520 and the second antenna 590. The second RF module 570 may include at least one power amplifier 572*a* and 572*b*, at least one LNA 578*a* and 578*b*, and at least one duplexer 576*a* and 576*b*, and the number of each component is not fixed. The configurations and/or functions of the at least one power amplifier 572*a* and 572*b*, the at least one LNA 578*a* and 578*b*, and the at least one duplexer 576*a* and 576*b* included in the second RF module 570 may be substantially the same as those of the power amplifier 532, the LNAs 538*a*, 538*b*, and 538*c*, and the duplexers 536*a*, 536*b*, and 536*c* of the first RF module 530.

According to various embodiments, the second RF module 570 may include a coupler module 580 arranged between the duplexers 576*a* and 576*b* and the second antenna 590. The coupler module 580 may include an antenna switch 582 and an internal coupler 584. A transmission signal output from the second RF module 570 to the second antenna 590 and/or a coupling signal of a reflected signal of the transmission signal may be output from the internal coupler 584.

According to various embodiments, the first RF module 530 may include a coupler switch 544 for switching between the transceiver 520 and the main coupler 550 or the internal coupler 584 of the second RF module 570. The output port 545 of the coupler switch 544 may be connected to the transceiver 520.

According to various embodiments, the coupler switch 544 may include a plurality of input ports 546, 547, 548, and 549. According to an embodiment, the first input port 546 and the second input port 547 of the coupler switch 544 may be connected to the main coupler 550. Here, a FWD coupling signal corresponding to a transmission signal may be input from the main coupler 550 through the first input port 546, and a RVS coupling signal corresponding to a reflected signal may be input from the main coupler 550 through the second input port 547.

According to various embodiments, the third input port 548 of the coupler switch 544 may be connected to the internal coupler 584 of the second RF module 570. A FWD coupling signal and a RVS coupling signal may be output from the internal coupler 584 of the second RF module 570 in a transmission path of the second RF module 570 and the second antenna 590, and each output coupling signal may be transmitted to the transceiver 520 through the third input port 548.

According to various embodiments, the electronic device 500 may transmit signals in a plurality of frequency bands using the first antenna 560 and the second antenna 590. For example, the electronic device 500 may support EUTRA-NR dual connectivity (EN-DC), may output a 4G LTE signal using the first RF module 530 and the first antenna 560, and may output a 5G NR signal using the second RF module 570 and the second antenna 590. In this case, coupling signals for each of the 4G LTE transmission signal and reflected signal and the 5G NR transmission signal and reflected signal may be transmitted to the transceiver 520, and the coupling signals may be respectively transmitted to the transceiver 520 through the switching operation of the coupler switch 544.

According to various embodiments, the coupler switch 544 may sequentially switch between the output port 545 and the plurality of input ports 546, 547, 548, and 549. For example, the first RF module 530 may transmit a signal of band 8 (900 MHz band) of 4G LTE, and the second RF module 570 may transmit a signal of band 3 (1.8 GHz band) of 5G NR.

According to an embodiment, the coupler switch 544 may perform switching to allow the output port 545 and the first input port 546 to be connected to each other in a first period, and a FWD coupling signal corresponding to a transmission signal of the transmission path of the first RF module 530 output from the main coupler 550 may be transmitted to the transceiver 520 through the coupler switch 544. The transceiver 520 may detect the power of a transmission signal of band 8 of 4G LTE transmitted through the first antenna 560 based on the received FWD coupling signal.

According to an embodiment, the coupler switch 544 may perform switching to allow the output port 545 and the second input port 547 to be connected to each other in a second period, and a RVS coupling signal corresponding to a reflected signal of the transmission path of the first RF module 530 output from the main coupler 550 may be transmitted to the transceiver 520 through the coupler switch 544. The transceiver 520 may confirm the magnitude of a reflected signal transmitted from the first antenna 560 to the first RF module 530 and/or voltage standing wave ratio (VSWR) of the transmission signal based on the received RVS coupling signal.

According to an embodiment, the coupler switch 544 may be turned off in a third period, and the coupling signal may not be input to the transceiver 520 in an off state. This is to determine whether the corresponding coupling signal is a coupling signal of a first transmission signal of band 8 of 4G LTE in the transceiver 520 and/or the processor 510, or a coupling signal of a second transmission signal of band 3 of 5G NR by putting a gap between an input of the coupling signal from the main coupler 550 and an input of the coupling signal from the internal coupler 584 of the second RF module 570.

According to an embodiment, the coupler switch 544 may perform switching to allow the output port 545 and the third input port 548 to be connected to each other in a fourth period. Here, a FWD coupling signal corresponding to a transmission signal of the transmission path of the second RF module 570 output from the internal coupler 584 of the second RF module 570 may be transmitted to the transceiver 520 through the coupler switch 544. The coupler switch 544 may maintain a connection between the output port 545 and the third input port 548 in a fifth period, and a RVS coupling signal corresponding to the reflected signal of the transmission path of the second RF module 570 may be transmitted to the transceiver 520 through the coupler switch 544. The transceiver 520 may confirm the power and/or VSWR of a transmission signal of band 3 of 5G NR transmitted through the second antenna 590 based on the coupling signal received from the internal coupler 584 of the second RF module 570 in the fourth and fifth periods.

According to an embodiment, the coupler switch 544 may be turned off in a sixth period. The coupler switch 544 may repeatedly perform switching of the first to sixth periods, and the transceiver 520 may confirm the power and/or VSWR of the transmission signal of the antennas 560 and 590 based on the coupling signal obtained in each time period.

Based on a comparison between the electronic device 500 of the embodiment of FIGS. 6 and 7 and the electronic device 300 or 400 of the embodiment of FIG. 3 or 4, by using the external coupler 550 provided separately from the RF modules 530 and 570, term may be fixedly determined to secure stable performance. In addition, since there is no path that is directly connected between the coupler switch 544 and the antenna switch 542, noise due to coupler switching can be reduced and sensitivity degradation due to the noise can also be reduced. According to an embodiment, the electronic device 500 may design the main coupler 550 separately from the first RF module 530 by utilizing the embedded coupler technology, and accordingly, there is no increase in cost for adding the coupler. In addition, since the RF modules 530 and 570 can be designed excluding the coupler, there is an advantage in terms of design cost.

An electronic device according to various embodiments of the disclosure may include a transceiver, a first RF module configured to amplify a first transmission signal input from the transceiver, a first antenna configured to output the first transmission signal amplified by the first RF module, and a main coupler configured to be provided outside the first RF module between transmission paths of the first RF module and the first antenna and to output a coupling signal corresponding to the first transmission signal.

According to various embodiments, the first RF module may include at least one power amplifier configured to amplify the first transmission signal and a switch configured to selectively connect between an output port connected to the transceiver and one of a plurality of input ports.

According to various embodiments, the plurality of input ports of the switch may include at least one input port which is connected to the main coupler and into which a coupling signal output by the main coupler is input.

According to various embodiments, the plurality of input ports of the switch may include a first input port to which a forward coupling signal coupled from the first transmission signal is input, and a second input port to which a reverse coupling signal coupled from a reflected signal corresponding to the first transmission signal is input.

According to various embodiments, the switch may connect the output port and the first input port in a first time period to perform switching so that the forward coupling signal is input to the transceiver, and may connect the output port and the second input port in a second time period after the first time period to perform switching so that the reverse coupling signal is input to the transceiver.

According to various embodiments, the switch may include a bidirectional coupler capable of generating the forward coupling signal and the reverse coupling signal.

According to various embodiments, the electronic device may further include a second RF module configured to be arranged outside the first RF module and to amplify a transmission signal input from the transceiver, and a second antenna configured to output the transmission signal amplified by the second RF module, wherein the second RF module may include an internal coupler configured to be provided inside the second RF module and to generate a coupling signal corresponding to the second transmission signal.

According to various embodiments, the switch may further include a third input port into which the coupling signal generated by the internal coupler of the second RF module is input.

According to various embodiments, the switch may connect the output port and the third input port in a third time period after the second time period to perform switching so that a forward coupling signal generated by the internal coupler of the second RF module is input to the transceiver, and may connect the output port and the third input port in a fourth time period after the third time period to perform switching so that a reverse coupling signal generated by the internal coupler of the second RF module is input to the transceiver.

According to various embodiments, the switch may be turned off for a designated time period after the second time period and then may connect the output port and the third input port in the third time period.

According to various embodiments, the first RF module and the second RF module may be configured to transmit transmission signals of different frequency bands.

According to various embodiments, the electronic device may support E-UTRAN NR-dual connectivity, the first RF module may generate a first transmission signal to be transmitted to a first cellular network, and the second RF module may generate a second transmission signal to be transmitted to a second cellular network.

According to various embodiments, the switch may be a complementary metal-oxide-semiconductor switch.

According to various embodiments, the first RF module may further include an antenna switch configured to selectively connect between a transmission path of a first transmission signal input from the transceiver and output through the first antenna and a reception path of a first reception signal received through the first antenna and output to the transceiver, and the antenna switch and the switch may be composed of one die.

According to various embodiments, the first RF module may further include at least one LNA configured to low-noise amplify the first reception signal.

According to various embodiments, the transceiver may be configured to monitor power and/or voltage standing wave ration of a transmission signal from a coupling signal input through the switch.

According to various embodiments, the transceiver may include one output port configured to be connectable to the main coupler.

According to various embodiments, the first RF module and the main coupler may be arranged on different areas on one printed circuit board).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:

a transceiver configured to output a first transmission signal;

a first radio frequency (RF) module configured to amplify the first transmission signal obtained from the transceiver to generate an amplified first transmission signal;

a first antenna configured to transmit the amplified first transmission signal; and a coupler along a transmission path between the first RF module and the first antenna, and configured to output a first coupling signal corresponding to the first transmission signal, wherein the coupler is connected to a fixed ground, wherein the first RF module comprises at least one power amplifier configured to amplify the first transmission signal, and a switch configured to connect one of a plurality of input ports with an output port connected to the transceiver, wherein the plurality of input ports of the switch comprise at least one input port connected to the coupler and configured to receive the first coupling signal output by the coupler, and wherein the coupler is provided outside the first RF module to reduce noise due to coupler switching in the first RF module.

2. The electronic device of claim 1, wherein the plurality of input ports of the switch comprise:

a first input port configured to receive a forward coupling signal coupled from the first transmission signal; and a second input port configured to receive a reverse coupling signal coupled from a reflected signal corresponding to the first transmission signal.

3. The electronic device of claim 2, wherein the switch is further configured to:

connect the output port with the first input port in a first time period to provide the first coupling signal to the transceiver, based on the first coupling signal corresponding to the forward coupling signal; and connect the output port with the second input port in a second time period after the first time period to provide the first coupling signal to the transceiver, based on the first coupling signal corresponding to the reverse coupling signal.

4. The electronic device of claim 3, wherein the switch further comprises a bidirectional coupler configured to generate the forward coupling signal and the reverse coupling signal.

5. The electronic device of claim 4, further comprising:

a second RF module provided outside the first RF module, and configured to amplify a second transmission signal to generate an amplified second transmission signal; and a second antenna configured to transmit the amplified second transmission signal, wherein the second RF module comprises an internal coupler provided inside the second RF module, and configured to generate a second coupling signal corresponding to the second transmission signal.

6. The electronic device of claim 5, wherein the switch further comprises a third input port configured to receive the second coupling signal generated by the internal coupler of the second RF module.

7. The electronic device of claim 6, wherein the switch is further configured to:

connect the output port with the third input port in a third time period after the second time period to provide the second coupling signal generated by the internal coupler of the second RF module to the transceiver, based on the second coupling signal corresponding to the forward coupling signal; and connect the output port with the third input port in a fourth time period after the third time period to provide the second coupling signal generated by the internal coupler of the second RF module to the transceiver, based on the second coupling signal corresponding to the reverse coupling signal.

8. The electronic device of claim 7, wherein the switch is further configured to turn off for a designated time period after the second time period, and connect the output port and the third input port in the third time period after the designated time period.

9. The electronic device of claim 5, wherein the first RF module is configured to transmit the amplified first transmission signal through the first antenna in a first frequency band, and the second RF module is configured to transmit the amplified second transmission signal through the second antenna in a second frequency band that is different from the first frequency band.

10. The electronic device of claim 5, wherein the electronic device is configured to support E-UTRAN NR-dual connectivity, the first RF module is configured to generate the first transmission signal to be transmitted to a first cellular network, and the second RF module is configured to generate the second transmission signal to be transmitted to a second cellular network.

11. The electronic device of claim 1, wherein the switch is a complementary metal-oxide-semiconductor switch.

12. The electronic device of claim 1, wherein the first RF module further comprises:

an antenna switch configured to select between a transmission path of the first transmission signal, from the transceiver to the first antenna, and a reception path of a first reception signal received through the first antenna and provided to the transceiver, wherein the antenna switch and the switch are configured by one die.

13. The electronic device of claim 12, wherein the first RF module further comprises at least one low-noise amplifier configured to low-noise amplify the first reception signal.

14. The electronic device of claim 12, wherein the first coupling signal is transmitted through a first path connecting the switch and the coupler, the first transmission signal is transmitted through a second path connecting the antenna switch and the coupler, and the first path and the second path are formed as different paths such that the switch and the antenna switch are not directly connected to each other.

15. The electronic device of claim 1, wherein the transceiver is configured to monitor at least one of a power of the first transmission signal, or a voltage standing wave ratio of the first transmission signal, based on the first coupling signal.

16. The electronic device of claim 1, wherein the transceiver comprises an output port that is connectable to the coupler.

17. The electronic device of claim 1, wherein the first RF module and the coupler are arranged on different areas on one printed circuit board.

* * * * *